United States Patent [19]

Blake et al.

[11] Patent Number: 5,019,233
[45] Date of Patent: May 28, 1991

[54] SPUTTERING SYSTEM

[75] Inventors: Julian G. Blake, Cambridge; Richard S. Muka, Topsfield; Peter R. Younger, Newton, all of Mass.

[73] Assignee: Eaton Corporation, Cleveland, Ohio

[21] Appl. No.: 434,605

[22] Filed: Nov. 8, 1989

Related U.S. Application Data

[63] Continuation of Ser. No. 264,571, Oct. 31, 1988, abandoned.

[51] Int. Cl.⁵ .................. C23C 14/34; B65G 49/05
[52] U.S. Cl. .................. 204/792.12; 204/298.25; 204/298.26; 118/719; 414/217; 414/222; 414/225
[58] Field of Search .................. 204/192.12, 192.32, 204/298.23, 298.25, 298.26, 298.27, 298.31, 298.35; 156/345; 414/217, 222, 225; 118/719, 724, 725

[56] References Cited

U.S. PATENT DOCUMENTS

| | | | |
|---|---|---|---|
| 3,521,765 | 7/1970 | Kaufman et al. | 204/298 |
| 4,405,435 | 9/1983 | Tateishi et al. | 204/298 |
| 4,595,483 | 6/1986 | Mahler | 204/298 |
| 4,657,617 | 4/1987 | Johnson et al. | 204/298 |
| 4,670,126 | 6/1987 | Messer et al. | 204/298 |
| 4,674,621 | 6/1987 | Takahashi | 198/378 |
| 4,675,096 | 6/1987 | Tateishi et al. | 204/298 |
| 4,680,061 | 7/1987 | Lamont, Jr. | 148/1.5 |
| 4,687,542 | 8/1987 | Davis et al. | 414/217 X |
| 4,693,777 | 9/1987 | Hazano et al. | 204/298 X |
| 4,715,921 | 12/1987 | Maher et al. | 156/345 |
| 4,717,461 | 1/1988 | Strahl et al. | 204/192.1 |
| 4,747,928 | 5/1988 | Takahashi et al. | 204/298 |

FOREIGN PATENT DOCUMENTS 0272141  6/1088  European Pat. Off. .

Primary Examiner—Nam X. Nguyen
Attorney, Agent, or Firm—F. M. Sajovec

[57] ABSTRACT

A system (10) for the vacuum processing of substrates such as semiconductor wafers which includes a central handling chamber (14), a number of separately pumped and randomly accessed process chambers (16-19), and dual load lock chambers (22) which communicate with the central handling chamber. This configuration permits one batch of substrates to be subjected to load lock evacuation while a second batch, having been previously evacuated, is transferred one at a time to selected process chambers. Substrate transfer from the load locks to the central handling chamber is by means of elevators (42) and by means of a handling assembly (24) which undergoes and Z motion only, with final transfer from the central handling chamber to the process chambers being accomplished by pivoting platen assemblies (66).

12 Claims, 10 Drawing Sheets

SPUTTERING SYSTEM

This is a continuation of copending application Ser. No. 0/264,571 filed on Oct. 31, 1988.

The present invention relates to the coating of thin substrates under vacuum, and more particularly to a modular sputtering system which is capable of sputter coating substrates either serially or in a selective access sequence.

In the fabrication of relatively small disk shaped objects, such as semiconductor wafers or data storage disks, multi-layered coatings must be applied to their surfaces in order to achieve certain properties or objectives. For semiconductor wafers a multi-layered conductive coating serves to provide electrical contact to the active portions of the circuit i.e., the resistors, capacitors, diodes and transistors, and further serves to interconnect these to provide a functional circuit. For a data disk, the multi-layered coating may consist of a magnetic layer for data storage and an overlayer to provide protection for the storage layer. The apparatus used to achieve such coatings have traditionally been classified into two types; batch coaters and single substrate coaters. Batch coaters process a multiplicity of substrates in a single coating operation whereas single substrate coaters sequentially Process individual substrates one at a time. This invention relates specifically to the achievement of multi-layered sputter coatings where the individual substrates are sequentially coated.

The sputter coating process requires an environment wherein a gas or gas mixture is maintained at a sub-atmospheric pressure. This gas is frequently argon which is preferred because of its chemical inertness and low cost, but gas mixtures may be used. For this reason, the coating apparatus must be capable of maintaining a sub-atmospheric pressure of typically 1 to 30 millitorr pressure, where atmospheric pressure is 760 Torr. Since residual atmospheric gases such as oxygen, nitrogen and water vapor can react with and contaminate the freshly deposited coating, the chambers which make up a sputter coating apparatus must be evacuated by means of a pumping system such that chamber atmospheric gas partial pressures of $10^{-7}$ Torr are routinely achievable, prior to the coating process, and maintained during the coating process as well as during the time interval between layer depositions. Finally, since different sputter coating process require different gas pressures or gas mixtures, it is desirable that some means be provided for achieving this diversity of process environments without cross-contamination.

One means of achieving these conditions is to configure the sputter coating apparatus with a central evacuated substrate handling or staging chamber with a valved means of accessing multiple process chambers, as well as a vacuum load-locked means of transporting wafers to and from the ambient environment. While such systems are commercially available there are several problems associated with such systems.

In a typical state-of-the-art system substrates are processed in a generally cylindrical central substrate handling chamber which is continuously evacuated by means of a vacuum pump. Surrounding the central substrate handling chamber are separately pumped process chambers and a separately pumped load lock. Interior to the central substrate handling chamber is a substrate handling robot which is capable of three degrees of motion, radial (R), circumferential ($\Theta$) and vertical (Z). The processing of substrates is accomplished in the following steps. First, the interior hermetic door which is capable of isolating the handling chamber from the load lock chamber is closed and lock vented to the atmosphere. Following this, the exterior hermetic door is opened to admit either a single substrate or a multiple-piece batch of substrates separately racked in a standard plastic cassette or the like. Thereafter, the outer hermetic door is closed and the load lock chamber evacuated until a predetermined degree of lock chamber evacuation is achieved, whereupon the inner hermetic door is opened to provide substrate access by the three-axis central substrate handler. A single substrate is extracted from the rack by an outward radial traverse of the robot arm. This places the substrate pick-up end of the wafer handler arm between adjacent substrates on the rack. A short upward Z traverse then lifts the substrate off its edge supports and the subsequent radial retraction of the robot arm carries the wafer to a position interior to the central substrate handling chamber. From this position, a ($\Theta$) motion allows the substrate to be carried to a position where it is aligned with a slot-shaped access port to a process chamber. A hinged hermetic door separating the process and central chamber then opens to allow radial extension of the substrate handler arm and the accompanying thrust of the substrate into the process chamber. The subsequent downward Z motion places the wafer on edge supports and the subsequent retraction of the substrate handler arm allows for the reclosing of the process chamber door and the hermetic isolation of the substrate in the separately pumped process chamber. The repetition of the above described actions allows for the sequential placement of the substrate in any one or all of the process chambers, thus allowing for sequential deposition of different layers without interlayer exposure to the atmosphere. Upon completion of the coating process, the substrate is returned to its position in the load lock rack which then allows for the eventual vent back and return to the atmosphere of the entire rack-full of coated substrates.

One disadvantage inherent in the configuration is the fact that the load lock evacuation occurs serially with respect to the coating process. Thus, any lengthening of the load lock cycle which may be required for minimization of particulate contamination, or minimization of residual gas transfer to the central substrate handling chamber carries with it the penalty of reduced productivity. Related to this is the similar restriction that the time constraints and engineering limitations do not permit the batch heating of the substrates in the lock. This limits the effective removal of adsorbed contaminants from the substrate surface prior to its introduction into the contamination sensitive portions of the coating apparatus. Thus a high level of contamination can find its way into the coating process.

Another disadvantage of this configuration has to do with the increased mechanical complexity introduced by the requirement that the central wafer handling robot have a radial motion capability. This requirement introduces the need for mechanisms and bearings to be present in the vacuum environment of the central substrate handling chamber where contamination considerations do not permit the use of lubricants. Accordingly, these mechanisms become prone to the generation of particulate contamination which if allowed to settle on the substrate surface will result in the unacceptable generation of coating defects. Similarly, these mechanisms are also prone to vibration which then implies the need for some type of edge contact with the substrate in order to maintain substrate placement accuracy. For silicon wafer substrates, such edge contact is a known source of particulate contamination.

A further disadvantage of the previously described configuration is associated with the relatively large process chamber volume which is required by the need to provide rotational means inside this chamber for placing the substrate in a vertical attitude. This increased process chamber volume results in a lengthening of the evacuation time needed before the substrate can be transferred back into the central wafer handling chamber without substantial risk of contamination. This need for increased dwell time in the process chamber reduces the productivity of the coating apparatus. Similarly, the larger relative volume of process to central handling chambers, implies a higher level of central handling chamber contamination at the chosen degree of process chamber evacuation where substrate transfer is carried out. This results from the fact that gaseous contaminants experience a dilution upon migrating from the process to the central handling chamber, which dilution decreases as the process chamber is made large relative to the central handling chamber. For both these above reasons, an apparatus configuration having large process chambers has a higher potential for residual gas cross-contamination.

To overcome the above shortcomings the present invention provides a central substrate handling or staging chamber with separately pumped process chambers, and dual load lock chambers which are alternately loaded with multiple-piece substrate batches (25 pieces being a standard batch of semiconductor wafers), using an external substrate handling robot. Accordingly, while one substrate batch is undergoing load lock evacuation, the second batch, having been previously evacuated, is accessible to the central wafer handling robot for purposes of execution of the coating process. For this reason, load lock dwell times are ordered parallel to the coating process and extended load lock dwell times do not impair apparatus productivity until the batch lock dwell time exceeds that time needed for the serial coating of a full batch of individual substrates. The benefit of this increased permissible lock dwell time is enhanced by the provision of means for heating the substrate batch. Thus, batch evacuation and thermal desorption are both accomplished before the opening of the interior load lock door which individually opens a given lock chamber to the central handling chamber.

Upon completion of this lock cycle, the opening of the interior lock chamber door allows the substrate rack to be accessed by a substrate handling robot located inside the separately pumped central wafer handling chamber. In accordance with the invention the wafer handling robot is provided with only a circumferential (Θ) and vertical (Z) translation capability. Accordingly, the previously described pick-up and place action permits individual substrates to be extracted from the metal rack, carried along the circular path and placed down on a series of two-position platens located on the circular path. Once the substrate has been transferred and the wafer handler moved away, a clamp is activated to cause the substrate to be held near its edge and pressed against the platen surface. Thereupon, the platen is caused to pivot 90°. This action causes the substrate to be placed vertically and thrusts it through a large opening in the central wafer handling chamber. Located opposite this opening is the sputtering source, hermetically mounted to the exterior wall of a separately pumped process chamber. This previously described pivoting motion also causes a hermetic seal to be effected between the platen housing and the interior wall of the central substrate handling chamber. This seal, located at the periphery of the large circular opening in the central substrate handling chamber, effectively isolates the process chamber from the central substrate handling chamber. Once this seal has been accomplished, the previously described sequence of sputter gas introduction, and application of sputtering source power, causes the substrate to become coated. Similarly, post-deposition re-evacuation of the process chamber, and the subsequent reverse pivot of the substrate platen opens the interchamber seal, and allows the unclamping and transfer of the substrate to another platen where the entire process is repeated to cause a second sputter-deposited layer to cover the first. By repetition of this action the substrates can be sequentially carried through a series of isolated process chambers where any desired combination of coating and etching operations may be performed. Once an entire batch has been sequentially processed and returned to the load lock rack, the load lock is sealed, vented back to atmospheric pressure, and the batch returned to the original plastic cassette from whence it had been extracted.

In addition to the dual batch load lock configuration, this configuration has the following advantages. (A) the central wafer handling robot, having no radial motion mechanism is capable of very smooth particulate free wafer transfer; (B) the individual process chambers are much smaller permitting much more rapid, contamination-free transfer of wafers through the sequences leading to the multi-layered substrate coating; and (C) the combination of this serial coating processing with parallel batch lock operation uniquely achieves a very high level of purity with regard to residual atmospheric gases.

Other advantages of the invention will be apparent from the following description when considered in connection with the accompanying drawings, wherein.

Figure 1:
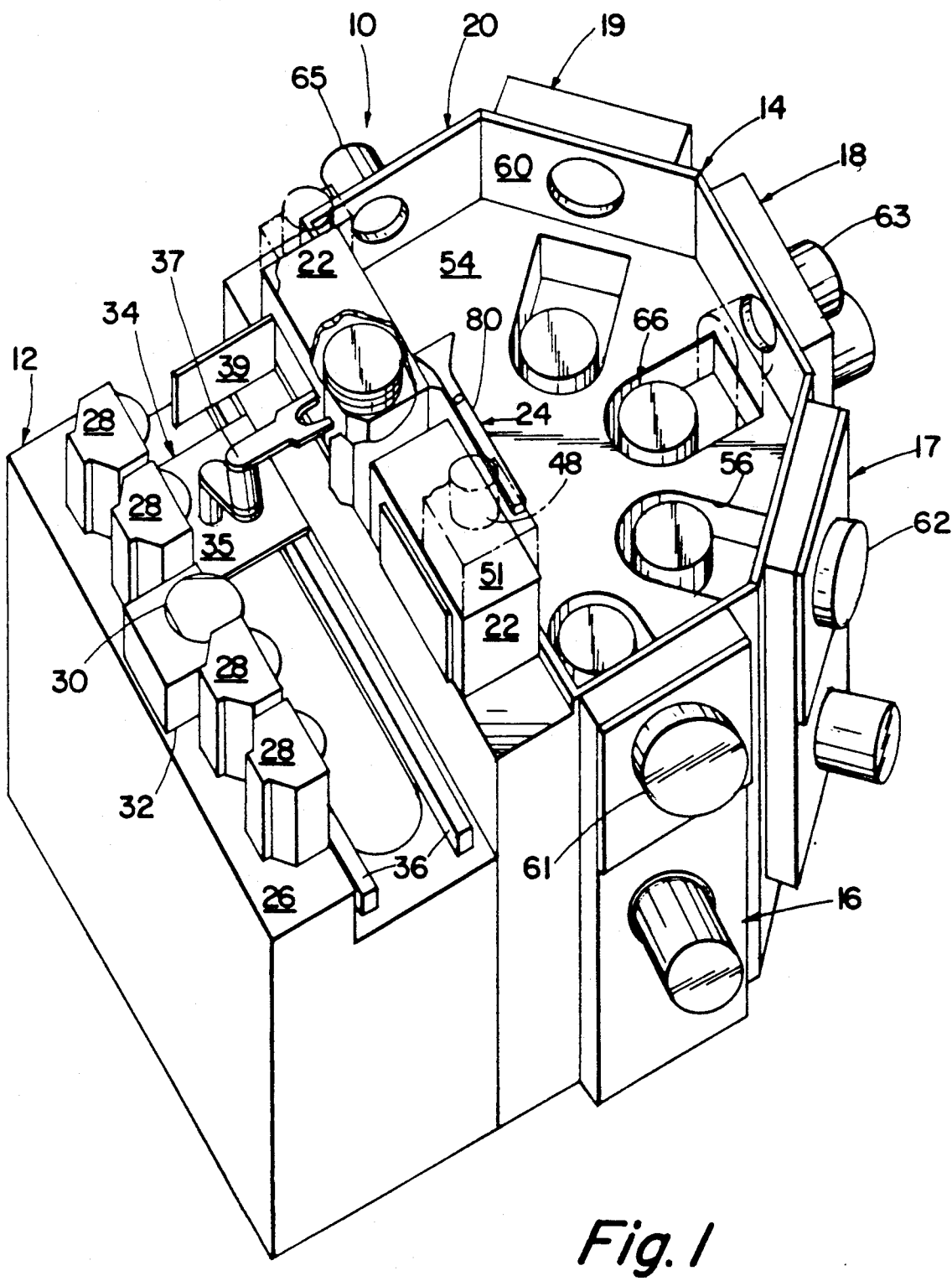
FIG. 1 is a perspective view of the sputtering system of the invention, with portions removed or cut away for clarity.

Referring to FIG. 1, there is illustrated a sputtering system, designated generally by the numeral 10, which includes a loading station 12 at atmospheric pressure, an evacuated central handling or staging chamber 14, a plurality of evacuated process chambers 16, 17, 18, 19 and 20, first and second load lock chambers 22 located between the staging chamber and the loading station, and a wafer handling assembling 24 located within the staging chamber. A top plate and removable cover (not shown) are received over the staging chamber to enclose the chamber for vacuum processing. For purposes of illustration herein the substrates to be sputtered will be described as semiconductor wafers, although it will be understood that the present invention can be used to coat other forms of substrates such as audio discs.

LOADING STATION

In accordance with a preferred embodiment of the invention the loading station comprises a platform 26 which receives four standard wafer cassettes 28 loaded with wafers 30, a flat finding station 32 which pre-orients each wafer with the flat in a predetermined angular position, and a handling assembly 34. As illustrated herein the handling assembly 34 comprises a platform 35 which is movable along rails 36 extending along the open faces of the cassettes 28, and an articulated wafer picking arm 37 mounted on the platform 35; however, it can be appreciated that a multi-axis robot system can also be used. The components of the loading station are well-known and commercially available items, and will not be described in further detail herein.

LOAD LOCKS

Figure 2:
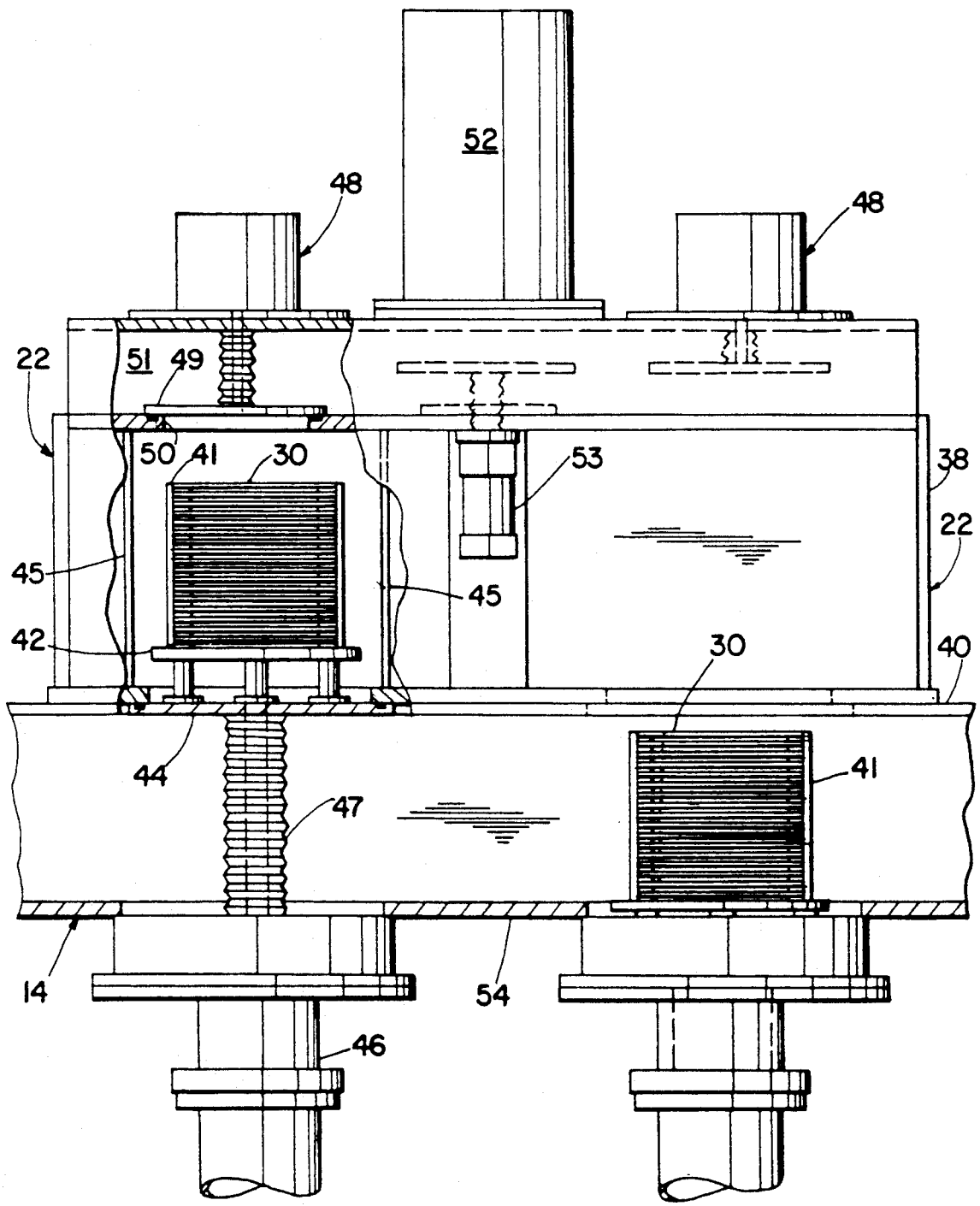
FIG. 2 is an elevation view, with parts cut away, of the load locks of the invention.

The load locks 22 are identical and are described interchangeably herein. In FIG. 2, the load locks are viewed from inside the staging chamber 14. Referring to FIGS. 1 and 2, the load lock 22 is a two-level structure including an upper level 38 having an access door 39 facing the loading station and a lower level 40 opening into the staging chamber 14 to provide access to the wafers 30 by the wafer handling assembly 24. Within the load lock there is mounted a rack 41 which includes a plurality of spaced-apart metallic wafer supporting elements. Each rack holds a standard cassette-load of twenty-five wafers and is received on an elevator 42 which is operable to position the rack at the upper level 39 to receive wafers transferred from the cassettes by the arm 37, and to move it downward to the lower level 40 in position to be accessed by the handling assembly 24. To maintain the vacuum integrity of the chamber 14 when an elevator is in the up position as shown on the left side of FIG. 2, the base 44 of each of the rack/elevator assemblies 41 defines a valve element which is operable to seal the opening between the upper and lower levels of the load lock.

The elevator actuating mechanism 46 is mounted below the chamber 14, and a bellows 47 surrounds the actuating shaft of the elevator to prevent vacuum loss. A poppet valve unit 48 is mounted atop the chamber and has a valve element 49 which is operable to open and close a port 50 between the chamber 22 and an upper plenum 51. A cryogenic pump 52 operates to evacuate the plenum 51 and chambers 22, while a poppet valve 53 controls the inlet to the pump.

Also mounted within the load lock chambers 22 are radiant heating units 45 disposed vertically on opposite sides of the rack 41. Preferably the heating units comprise a plurality of quartz halogen heating lamps such as those manufactured by USHIO INC. and designated as series QIR. When a rack is fully loaded and the load lock closed and evacuated, the heaters are effective to remove adsorbed contaminants from the wafer surfaces prior to the entry of the wafers into the staging chamber 14.

In operation, a cassette-load of wafers 30 is transferred, one-at-a-time, from one of the cassettes 28, to the flat-finder 32 and then to the rack 41 by means of the wafer handling assembly 34. The door 39 is then closed and the chamber partially evacuated using a mechanical roughing pump (not shown). One of the valves 49 is then opened and cryogenic pump 52 is activated to evacuate the open load lock 22 to a pressure approaching that of the chamber 14. Valve 53, shown in the open position in FIG. 2, is provided to close the inlet to the pump 52 for maintenance and regeneration of the pump. The heaters 45 are then energized to effect a batch degassing of the wafers. The valve 49 is then closed and the elevator 42 is moved downward to the position shown on the right side of FIG. 2, the downward movement opening the valve element 44 and thus opening communication between the right side load lock 22 and the staging chamber 14. At this point a rack load of wafers are in position to be accessed by the wafer handling assembly 24 as will be described in more detail below.

As noted above, the plenum 51 communicates with both load locks 22 the loading, evacuating, heating and transfer functions for both of the load locks being essentially the same as that described above.

STAGING CHAMBER

Referring to FIG. 1, the staging chamber 14 is essentially octagonal in plan view with three sides of the octagon cut off by the plane defined by the face of the load lock chamber. The bottom of the staging chamber is a plate 54 with a plurality of wells 56 formed therein arranged in a circular pattern about an axis defined by the axis of the handling assembly 24. The side walls 60 define interfaces between the staging chamber and the individual process chambers 16-20, and the top of the chamber is defined by a readily opened and removable cover, which is not shown herein in the interest of clarity.

Each of the chambers 16-20 could be used to perform any one of a number of different processes such as etching, or sputter coating. For example, a plasma etch unit 61 can be installed at chamber 16 and sputter sources 62 and 63 installed at process chambers 17 and 18, with chamber 19 having another sputter source (not visible) and chamber 20 being used as a vacuum pump station, with a vacuum pump 65 installed therein. It can be appreciated, however, that with relatively little modification chamber 20 could be employed as a sputtering or other processing station with the vacuum pump communicating with the staging chamber through, for example, the bottom plate 54.

Within each of the wells 56, there is mounted a platen assembly 66 (shown schematically in FIG. 1), which is pivotable from a wafer transfer position shown in solid line in FIG. 1, to an operating position shown in broken line only at process station 18. As will be discussed in detail below, the platen serves both as means for retaining wafers and as a valve for isolating the process chamber from the staging chamber when the wafers are being processed, or when a particular process chamber is undergoing maintenance.

Wafers are transferred between the load locks 22 and the process chambers 16-19, or from one of the process chambers to any one of the other process chambers by means of the wafer handling assembly 24.

WAFER HANDLING ASSEMBLY

Figure 3:
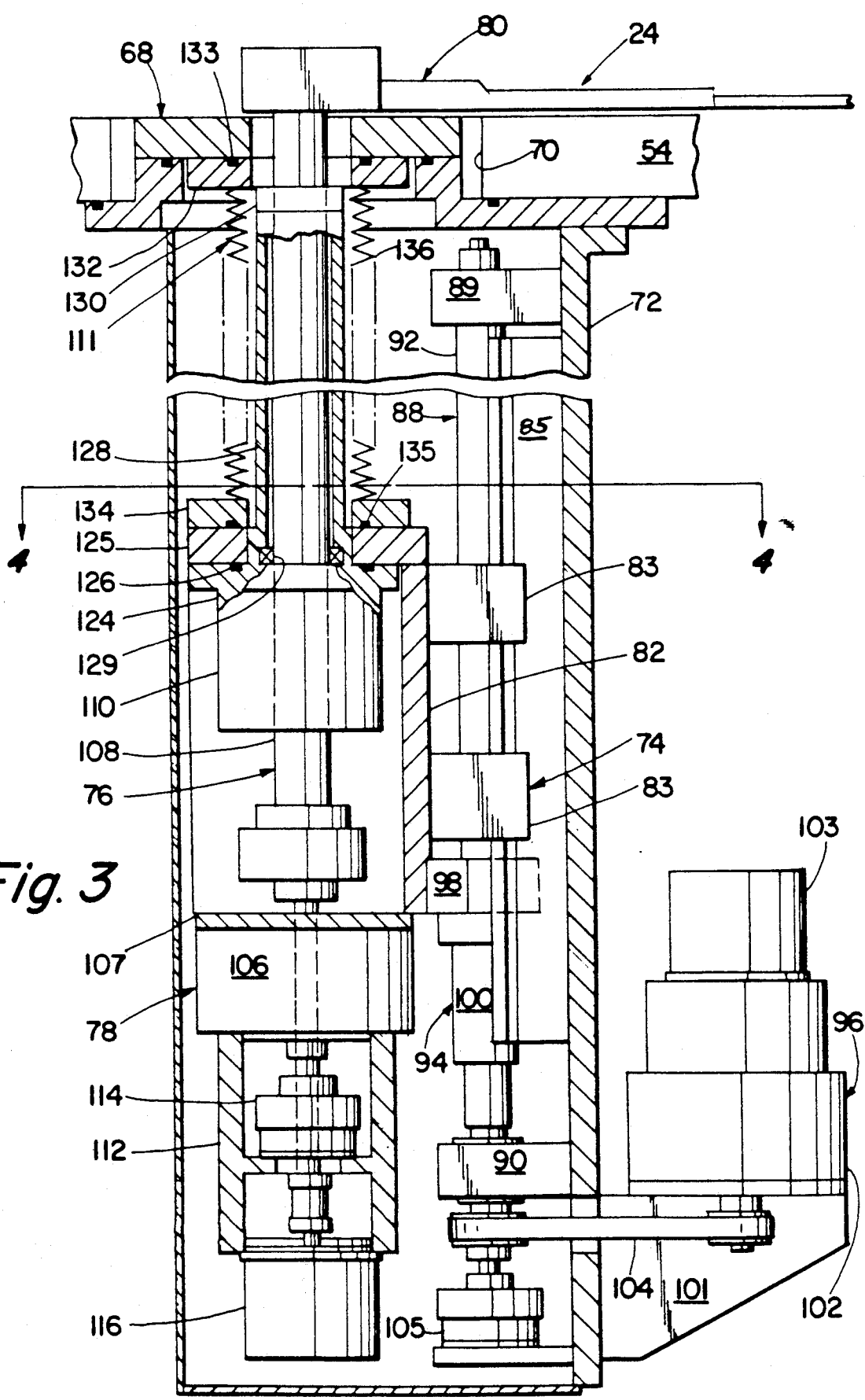
FIG. 3 is a sectional view of the wafer handling assembly of the invention.
Figure 4:
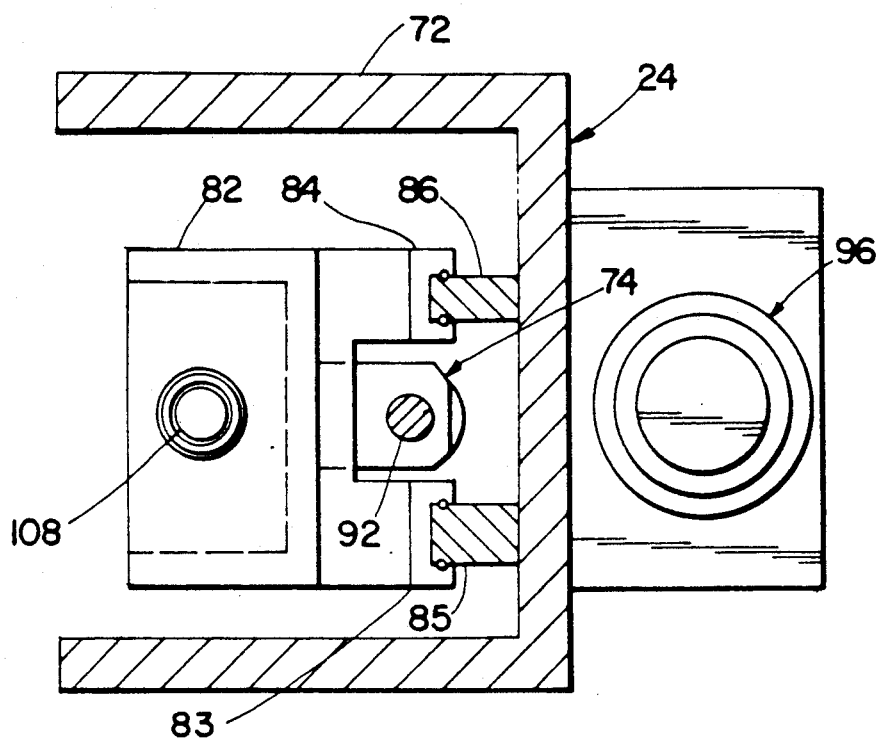
FIG. 4 is a sectional view taken along line 4—4 of FIG. 3.

Referring to FIGS. 3 and 4, there is illustrated the wafer handling assembly 24, comprising a mounting flange assembly 68 received in an opening 70 formed through the bottom plate 54 of the staging chamber, a support plate 72 attached to and depending from the flange assembly, a lead screw linear drive system supported by the plate 72 and designated generally by the numeral 74, a drive shaft assembly 76 mounted on the drive system for linear movement i.e. the required Z axis movement of the handling assembly, a rotary drive system 78 mounted on the shaft assembly to provide the (Θ) movement of the handling assembly, and a handling arm 80 attached to the shaft assembly and adapted to receive wafers for transfer to and from the process stations and the load locks.

The support plate 72 is essentially a channel as shown in plan view in FIG. 4, to which the movable elements of the wafer handling assembly are mounted, including the linear drive system 74 and the rotary drive System 76.

The linear drive assembly 74 comprises a housing 82, also in the form of a channel, which supports the drive shaft assembly 76 and the drive system 78, pairs of bearing carriers 83, and 84 attached to the housing, a pair of rails 85 and 86 attached to the plate 72 on which the bearing carriers are supported, and a lead screw drive assembly designated generally by the numeral 88.

The bearing carriers 83-84 enclose low-friction linear bearings which ride on the rails 86. The lead screw drive assembly 88 comprises upper and lower spacers 89 and 90 attached to the plate 72, a lead screw 92 mounted for rotation in the spacers, a lead nut assembly 94 attached to the housing 82, and a drive system 96. The lead nut assembly 94 comprises a support block 98 fixed to the housing 82 and attached to a lead nut unit 100 of the ball screw assembly. As is well known in the art, rotation of the lead screw 92 within the lead nut assembly 94, causes the housing 82 to move up or down along the rails 85, 86 depending on the direction of rotation of the screw. Rotation of the lead screw 92 is provided by a motor and gear unit 102, mounted on a support bracket 101 attached to the plate 72, which drives the screw by means of a timing belt 104. A brake 105 fixed to the plate 72 and operating on the lead screw 92 maintains the position of the linear drive system in the event of a loss of power. A shaft encoder 103, also driven by the motor 102 provides Z motion information to a control system for the handling assembly.

The rotary drive system 78 comprises a drive motor 106 supported by a plate 107 welded to the housing 82, an output shaft 108 coupled to the motor output shaft, a rotary seal assembly 110 surrounding the shaft 108, a bellows assembly 111, and the handling arm 80 attached to the end of the output shaft.

A cylindrical housing 112 depends from the motor 106, and a brake 114, similar to the brake 105, is mounted on the housing and is coupled to the motor output shaft. A shaft encoder 116 also driven by the motor 106 is mounted on the housing 112 to provide motion information to the control system.

Since the area above the plate 54 is under vacuum, the sealing of the drive assembly to prevent vacuum loss, and to avoid contamination of the handling chamber is very important. To this end the rotary seal assembly 110 provides a highly reliable means to isolate the rotating components from the vacuum system, while the bellows eliminates the need for sliding seals. The rotary seal is preferrably a type of seal referred to as FERROFLUIDIC, which is a registered trademark of FERROFLUIDICS CORPORATION, which is well known in the art and will not be described in detail herein. As illustrated in the preferred embodiment shown in FIG. 3. The rotary seal is enclosed within a cylindrical housing 124 which is suspended from an end member 125 of housing 82 and sealed thereagainst by means of an O-ring 126. The housing 124 includes an elongated cylindrical extension 128 which supports the output shaft 108 through a lower bearing 129 and an upper bearing (not shown) within an end cap 130 of the housing 124.

As illustrated in FIG. 3, the handling assembly must undergo significant vertical or Z axis travel in order for the handling assembly to access a full cassette load of wafers positioned on the racks 41. To accommodate this motion without employing sliding seals, the sealed bellows assembly 111 is installed between the drive system housing 82 and the plate 54 which defines the floor of vacuum chamber 14. The bellows assembly comprises an upper flange 132 which is attached to the top member of the flange assembly 68 and sealed thereagainst by an O-ring 133, a lower flange 134 attached to the end member 125 of the housing 82 and sealed by an O-ring 135, and a metallic bellows 136 which surrounds the extended portion 128 of the rotary seal assembly 116 and is fixed to the flanges 132 and 134 by welding or brazing or the like.

Figure 5:
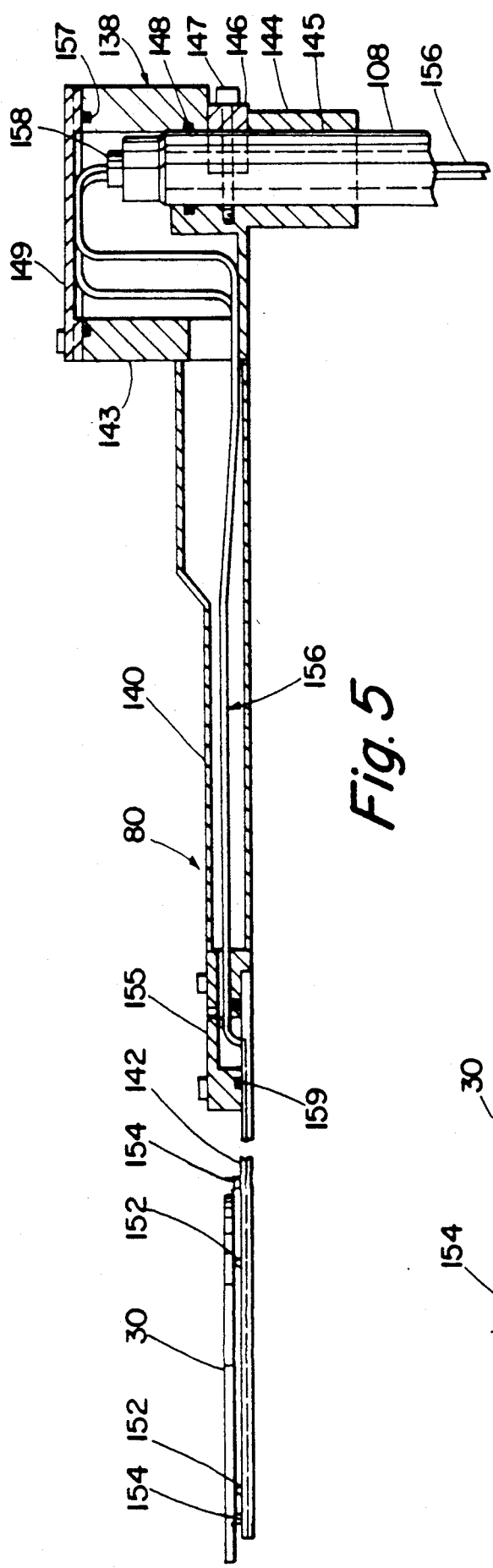
FIG. 5 is a sectional view of the wafer handling arm of the invention.
Figure 6:
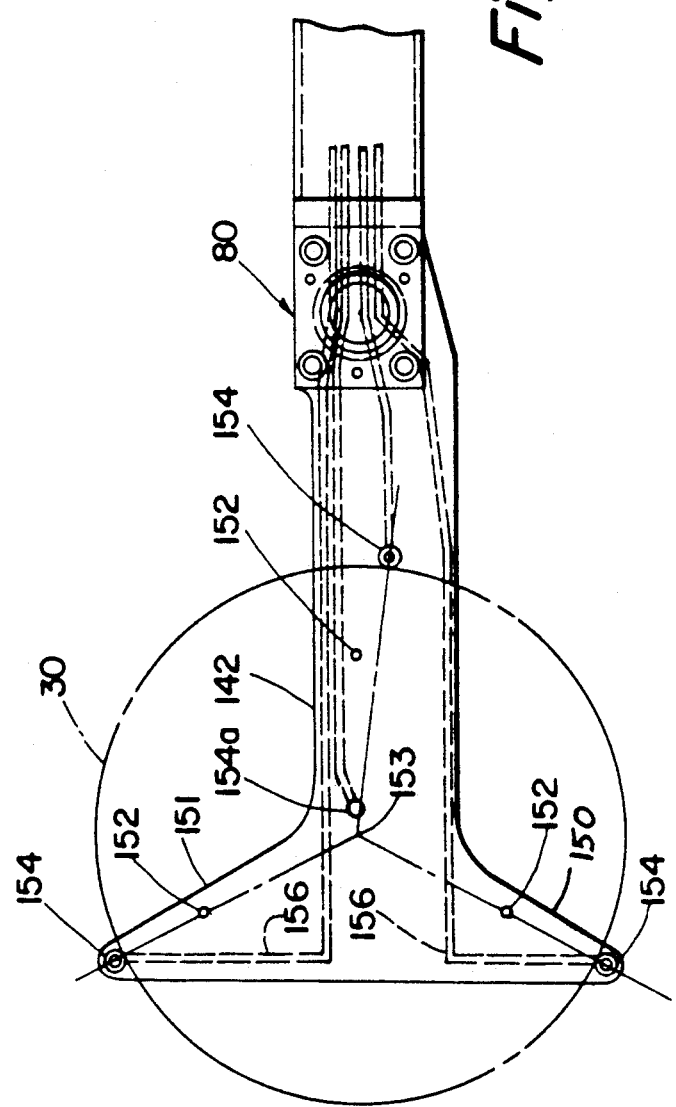
FIG. 6 is a plan view of the wafer handling arm.

Referring to FIGS. 5 and 6, the wafer handling arm 80 is a fabricated structured comprising a hub assembly 138 an arm structure 140 and a wafer-receiving paddle 142. The hub assembly comprises a substantially rectangular housing 143 with a downwardly projecting hub 144 which fits over the end of shaft 108 and is attached thereto by means of a key 145 and a yoke clamp member 146 which is received in an opening formed in the housing and includes a portion partly encircling the shaft. The clamp member is attached to the housing by means of screws 147 (one of two shown). An O-ring 148 is received in a groove formed in the housing and seals against the shaft 108. A cover 149 bolted to the housing closes the upper end of the housing and is sealed thereagainst by an O-ring 157 received in an oval groove formed in the housing.

The arm 140 is a fabricated metal box, rectangular in cross-section, which is welded to the housing 143. The outer end of the arm is welded to an end cap 155 to which the paddle 142 is bolted. Referring particularly to FIG. 6, the paddle 142 is a relatively thin, substantially solid member which is bolted to the end cap 155. The free end of the paddle is formed with arms 150 and 151 with the wafers 30 (shown in broken line in FIG. 6) being supported on three contact points 152 distributed about a centerpoint 153 on the longitudinal axis of the arm assembly. The paddle is relatively thin, as noted above, to enable the paddle to fit between wafers in the racks 41, and as shown in FIG. 6 the paddle is offset from the centerline of the arm assembly to facilitate entry of the paddle into the platen assemblies as will become more apparent from the description below. It should be noted that the wafers are maintained on the arm by gravitational force only, with no other restraint.

The paddle 142 includes three capacitive proximity sensors 154 which are received in depressions formed in the bottom surface of the paddle and distributed 120° apart at a radial location corresponding to the edge of a wafer. The sensors protrude above the top surface of the paddle and above the pins 152. A fourth sensor 154a is centrally located and is flush to the top surface of the paddle. These sensors can be of a type manufactured by Cox Engineering Company and designated as Model SR2 and will not be described herein in detail. The central sensor serves to detect the presence of a wafer on the paddle and the outer sensors sense the position thereon. A slight deviation from the position shown in FIG. 6 wherein the edge of the wafer approaches within a set distance of the three outer sensors will be detected so that misalignment and potential damage of the wafers when they are placed on a platen assembly can be avoided.

The sensors 154 and 154a indicate wafer position by producing a voltage level change in a binary manner, i.e. high voltage at sensor 154a indicates that a wafer is present; whereas a low voltage indicates no wafer. Similarly, low voltage at all three of the edge detectors 154 indicates that the wafer edge is in the proper location; whereas, high voltage at any sensor indicates that the wafer is approaching the sensor and is not in proper position. After a wafer is received on the paddle both a wafer presence and proper wafer position signals must be received before the arm is moved. If the wafer is tipped in any direction the 20, wafer presence sensor 154a will provide a proper signal, and a wafer presence signal will be issued. If the presence condition is satisfied but the wafer does not lie within the three sensors 154, the wafer will be returned to its present status, the arm will be repositioned in a direction dependant upon which of the three sensors failed to provide the proper signal, and the wafer will be lifted again to go through another position sensing sequence. If proper positioning is sensed the paddle will be moved to transfer the wafer to its next station. If after a second try proper positioning cannot be established manual intervention will be required to resolve the error.

It can be appreciated that the insertion of electrical components such as the sensors 154 into the vacuum system can cause problems, particularly in association with a rotating component such as the arm assembly 80. In accordance with the invention the electrical lines for the capacitive sensors, collectively designated 156, are routed to connecting points below the staging chamber through the center of the hollow shaft 108, into the housing 143, through connector block 158 and connectors within the housing, and then through the arm 140 to the paddle 142 where they extend through sealed openings and are received within channels formed in the underside of the paddle. As described above, the area below the plate 54, including the interior of the shaft 108 are at atmospheric pressure; however, the O-rings 148 and 157, and an O-ring 159 between the end cap 155 and the paddle, along with the sealed openings in the paddle, maintain the integrity of the vacuum within the chamber 14.

In operation, the handling assembly is initially positioned adjacent to a rack 41 within one of the load locks 22. Then the motor/gear unit 102 is energized to rotate the lead screw 92 and drive the housing 82 upward to position the arm assembly 80 vertically in position such that the wafer paddle 142 is slightly below a selected wafer within the rack 41. The rotary drive motor 106 is then energized to rotate the arm until the paddle is aligned beneath its selected wafer. The linear drive system is again actuated to raise the arm slightly to engage the wafer with the contact points 152. The arm is then rotated out of the load lock and lowered to the FIG. 3 position, after which the rotary drive system is again energized to rotate the paddle to a position over any one of the platens 66 to deposit the wafer thereon for processing, as will be described in detail below.

PLATEN

Figure 8:
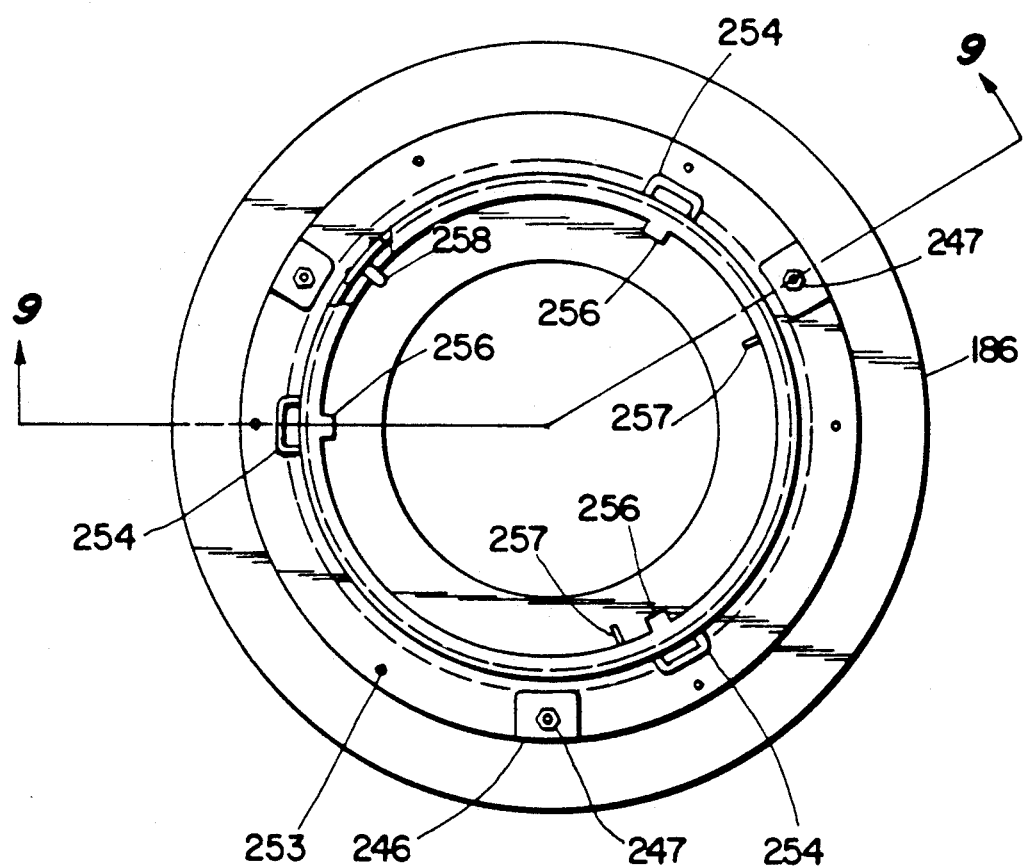
FIG. 8 is a plan view of the platen assembly.
Figure 7:
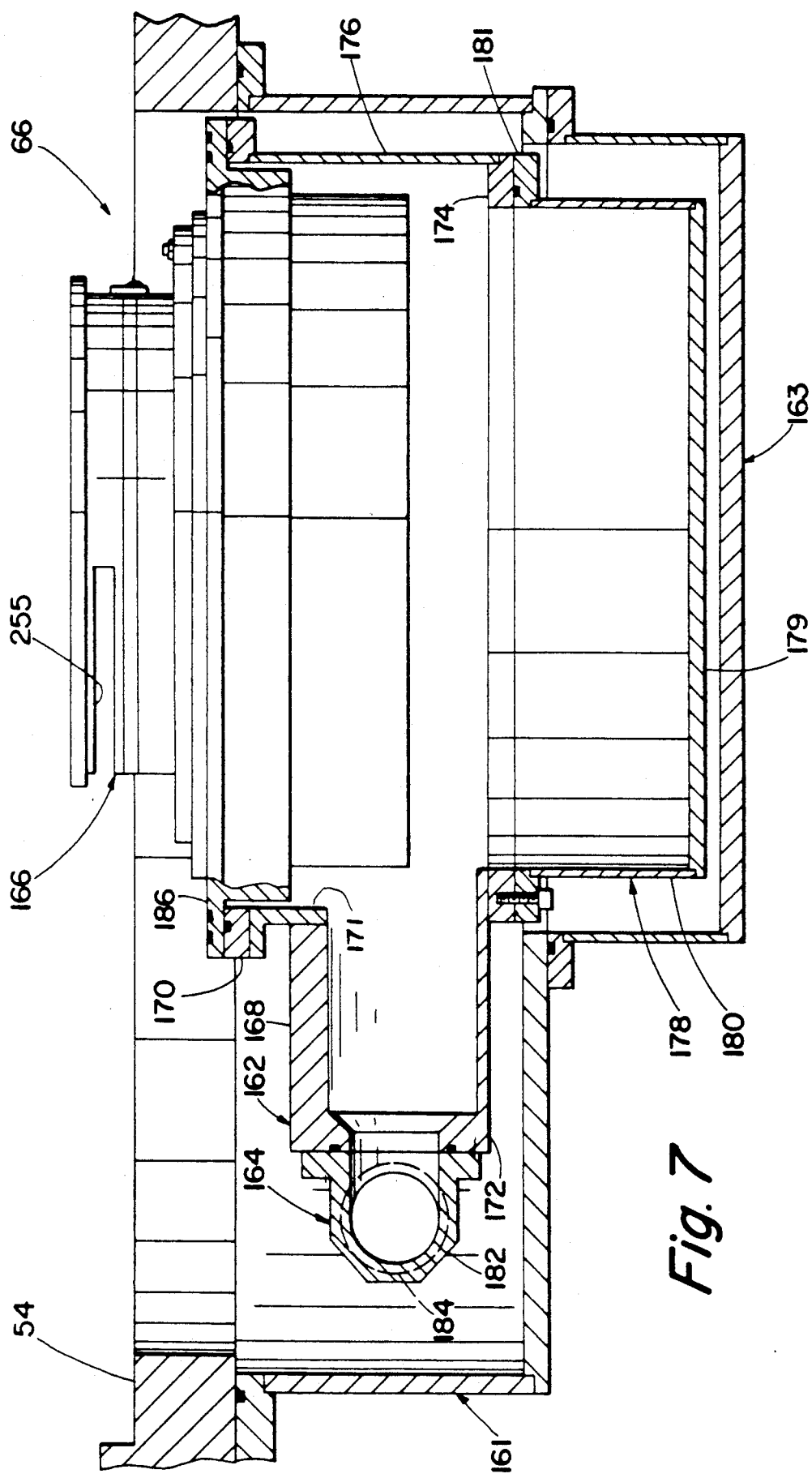
FIG. 7 is a view, shown partly in section of a platen assembly of the invention.
Figure 9:
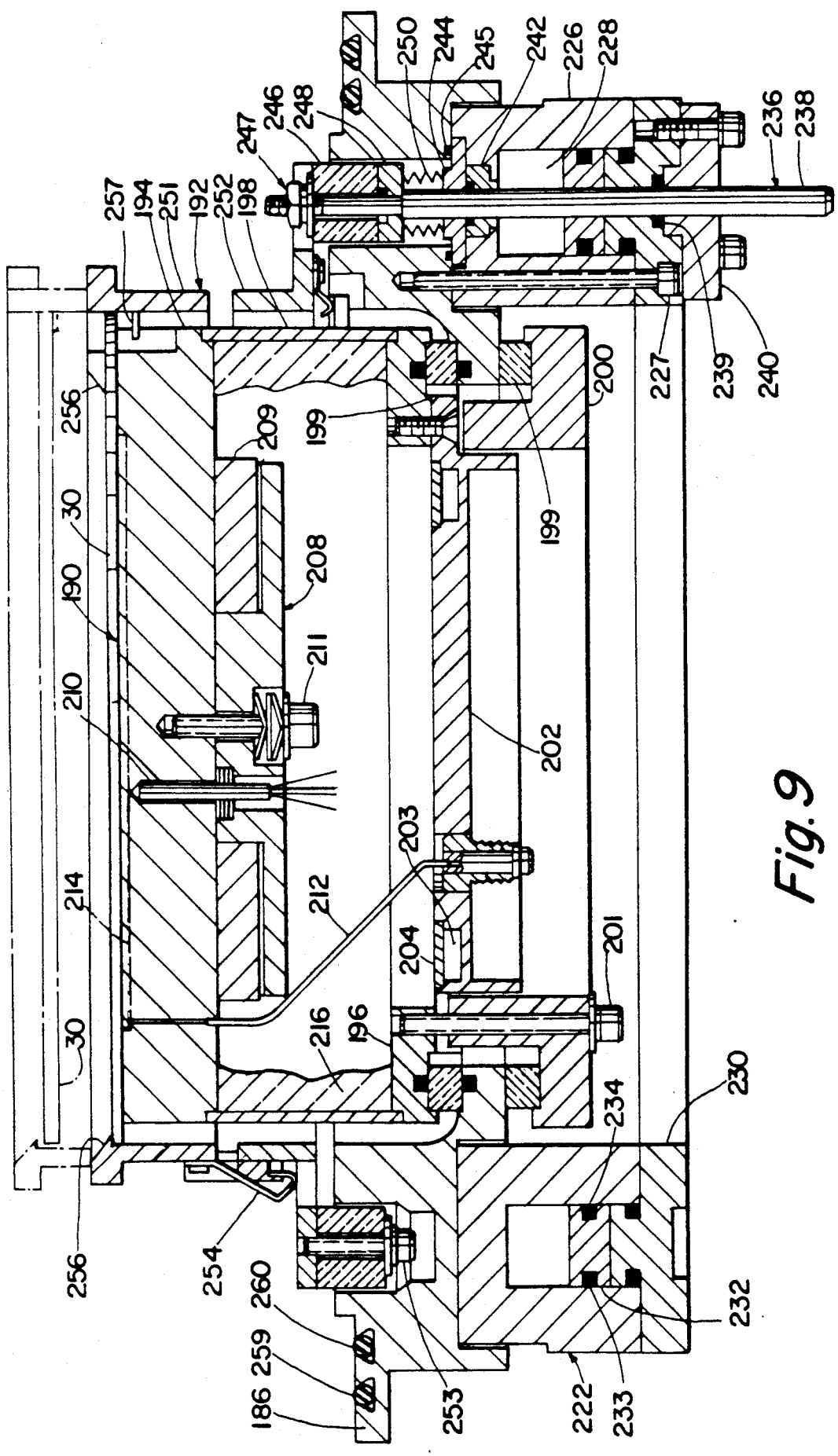
FIG. 9 is a sectional view taken along line 9—9 of FIG. 8.

Referring particularly to FIGS. 7, 8 and 9, there is illustrated the platen assembly 66 of the invention. In accordance with the invention the platen assembly comprises an essentially enclosed housing 162, a pivot assembly 164 attached to the end of the housing, and a platen 166.

The housing 162 comprises an upper support plate 168, a support ring 170 welded to an arcuate member 171 which in turn is welded to the upper support plate, a lower support plate 172 which can be integral with the upper plate, a lower ring 174 welded to the plate 172 and a side wall member 176 which encircles the rings 170 and 174 and is welded thereto, and which extends outward from the ring members to cover the open sides between the support plates 168 and 172, to which it is also welded. A cylindrical cover 178, including a disk 179, a tube 180 welded to the disk, and a ring 181 welded to the tube; is bolted to the ring 174.

The pivot assembly 164 comprises an elongated housing 182 (see FIG. 10) bolted to the ends of the support plates 168 and 170, hollow stub shafts 184 welded to the housing and extending through seal and bearing units 160 received in the well structure 56 the seals preferably being FERROFLUIDIC seals. The well structure is in the form of a first sealed box structure 161 having the rounded-end rectangular shape illustrated in FIG. 1, with a secondary cylindrical box structure 163 attached thereto to provide clearance for the bottom portion of the platen assembly. The bearing units 160 extend through the sides of the first box structure 161, and one of the stub shafts is connected to a drive system designated 165 which can be in the form of air cylinder and lever arm system as shown schematically in FIG. 10, and which is operable to move the platen between its horizontal loading position and its vertical operating position.

Referring particular to FIGS. 7, 8 and 9, the platen 166 comprises an annular frame member 186 which is fastened to the ring 170 by means of screws (not shown), a wafer support assembly 190 clamped to the frame member 186, and a wafer clamp assembly 192 supported by the frame member 186 and movable relative thereto to selectively clamp a wafer to the support assembly 190 and to release it therefrom.

The wafer support assembly 190 comprises a relatively thick, essentially solid circular platen element 194; a lower ring member 196 spaced from the platen 194; a relatively thin, tubular member 198 connecting the platen 194 and ring 196 and welded thereto; and a clamp ring 200 which is fastened to the ring 196 by screws 201 and which clamps the wafer support assembly 190 to an inwardly projecting flange portion of the lower ring 196 through insulating rings 199.

A circular plate member 202 is fastened to the bottom of ring 196 and substantially closes the bottom of the support assembly 190. The plate 202 has an annular channel 203 formed therein which is closed by a ring 204 to define an annular cooling water channel.

An electrical resistance heater unit 208 is fastened to the platen 194 by a bolt/spring washer assembly 211 and includes a circular heating element 209 in contact with the platen 194. A temperature probe 210 is received through the heating element 208 and is imbedded in the platen 194 just below the wafer receiving surface. A gas line 212 is received through the plate 202 and extends through the platen 194 to communicate with one or more channels 214 formed in the surface of the platen to supply gas to effect gas conduction cooling of a wafer 30 received on the support assembly. The remaining volume between the platen 194 and the plate 202 is filled with a thermal insulating material 216.

WAFER CLAMP

Referring to FIGS. 8 and 9, wafers 30 are retained on the platen assembly for processing by a clamp system mounted on the platen. The clamp system comprises an annular actuating cylinder assembly 222 supported by the frame member 186, and the clamp assembly 192, which is supported by the frame and actuated by the cylinder assembly 222.

The cylinder assembly comprises an annular member 226 attached to the frame member 186 by bolts 227, and having an annular recess formed therein to define a fluid cylinder 228. A sealed cover member 230 covers the open end of the cylindrical member 226 and is fastened thereto by the bolts 227 to sealingly enclose the cylinder 228. An annular piston 232 is received within the cylinder 228 and is sealed therein by inner and outer O-rings 233 and 234. Looking at the right side of FIG. 9, there is illustrated one of three piston rod assemblies 236 attached to the annular piston 233. The piston rod assembly comprises a rod 238 extending through the piston and the cover member 230 and press fit to the piston. The shaft is sealed at the lower end of the cylinder by an O-ring 239 retained in place by a bearing cap 240 which aligns and supports the lower end of the piston rod, and at its upper end by an O-ring received in an insert 242 retained by a bearing cap 244 captured between the cylinder 226 and the frame member. An O-ring 245 provides a static seal between the cap and the frame.

The upper end of the shaft 238 has a reduced diameter portion which is received through a disc 248 and through an insulating ring 246 attached to the clamp assembly 192, the ring and disk being clamped between the shoulder formed by the reduced diameter portion of the shaft and a washer/nut assembly threaded onto the end of the shaft. A bellows assembly comprising the disc 248, the cap 244 and a metallic bellows 250 brazed or otherwise attached to the disc and cap maintains vacuum integrity. Fluid inlets (not shown) above and below the piston 232 permit the entry of fluid pressure to the cylinder 228 to selectively move the rod 238 up or down to actuate the clamp assembly.

The clamp assembly 192 surrounds the platen 194 and comprises an upper ring 251 and a lower ring 252 maintained in spaced relation to each other by three spring members 254 distributed about the clamp assembly. The lower ring has a flange portion which is attached to the insulating ring 246 by a plurality of screws 253. The spring members provide compliance between the wafer surface and the clamping plane when the clamp assembly engages the wafer. As best shown in FIG. 7, a section 255 of the upper ring 251 is cut away over about at 170° arc to provide access for the wafer arm 80 to deposit wafers on the platen 194 when the clamp assembly is in its up or retracted position as shown in broken line in FIG. 9.

A plurality (preferably three as shown in FIG. 8) of inwardly extending projections 256 are formed in the upper ring to engage a wafer for clamping to the platen surface. When the clamp is in its retracted position and a wafer is inserted through the opening 255 by the arm 80 the wafers are deposited on a set of projections extending inwardly from the upper ring below the opening, including pins 257 extending radially inward from the wall of upper ring and a finger 258 attached to the outer wall of the upper ring and extending upward into the opening and defining a plane with the pins.

To provide sealing of the platen assembly when it is positioned at a process station O-rings 259 and 260 are received in grooves formed in the face of the frame member 186. When the arm 80 is pivoted into position to place a wafer on the platen with clamp assembly in its up position, the paddle 142 enters into the opening 255, the arm assembly is lowered to deposit the wafer onto the pins 257 and finger 258, below and the arm is pivoted to another position away from the platen. Fluid pressure is then applied to the cylinder 228 above the piston 232 to move the piston downward, correspondingly moving the clamp assembly downward to first deposit the wafer on the platen surface, then clamp it thereon. When the wafer is in place on the platen the platen assembly is pivoted upward to position the wafer in a vertical position at the opening of a desired processing station as illustrated in FIG. 11, which for purposes of illustration is shown as a sputtering station including a sputter source 262.

ATMOSPHERIC CLAMP

Figure 11:
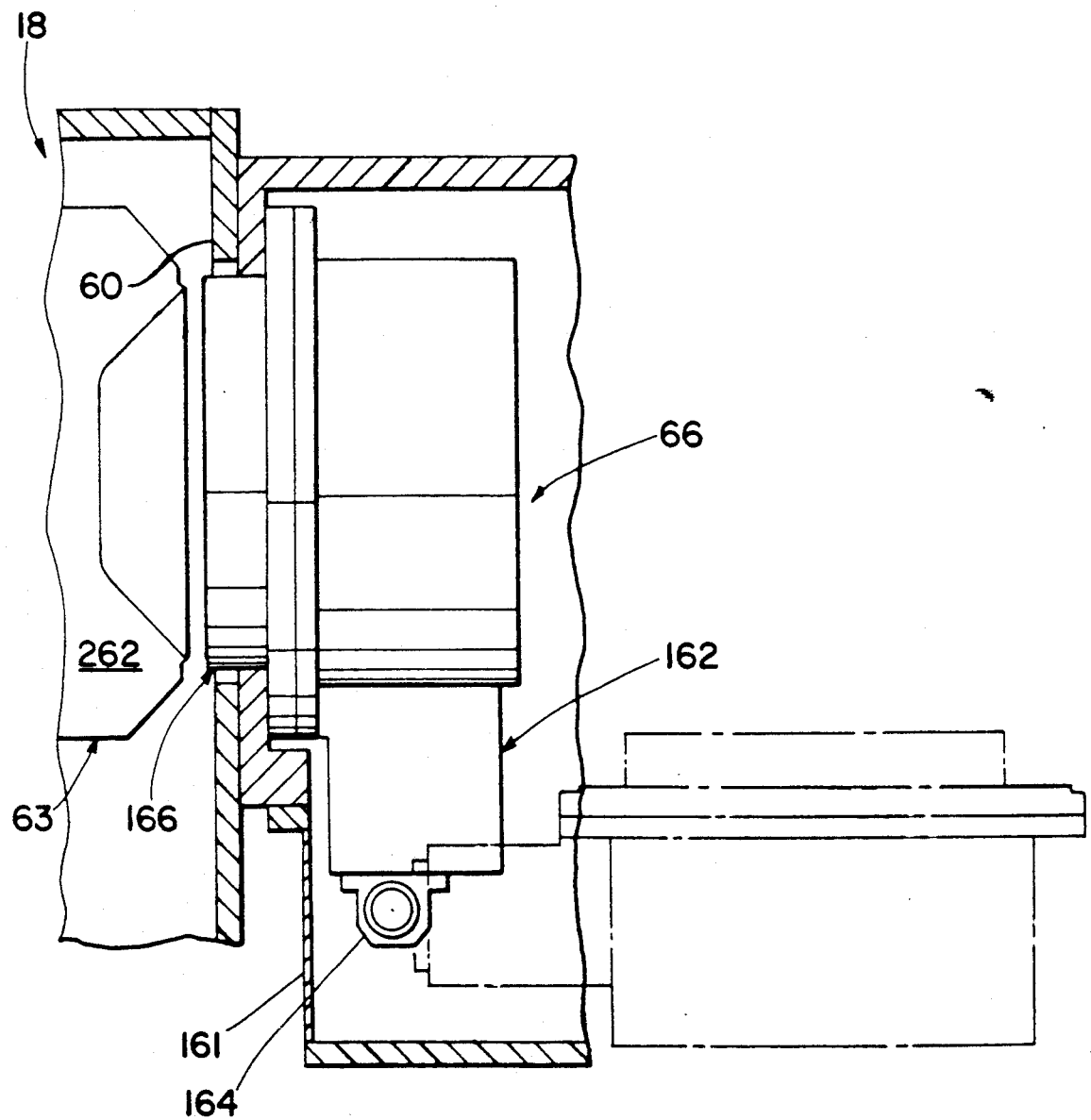
FIG. 11 is a schematic side elevation view of the platen assembly positioned at a process chamber.

In normal operation the platen rotary drive provides sufficient sealing force between the platen assembly and the wall of the staging chamber when the platen assembly is rotated to its operating position facing a process chamber, as illustrated schematically in FIG. 11, since the pressure differential between the evacuated staging chamber and the evacuated process chamber is low. When, however, a process chamber is undergoing maintenance either in place or removed from the sputtering apparatus, and operations are to continue at other process stations, it is necessary to close the affected process station, using the platen assembly as a door or cutoff valve. In such instances there will be atmospheric pressure acting on the outside of the staging chamber, in which case it is considered necessary to provide additional closure means to maintain the vacuum integrity of the system.

Figure 10:
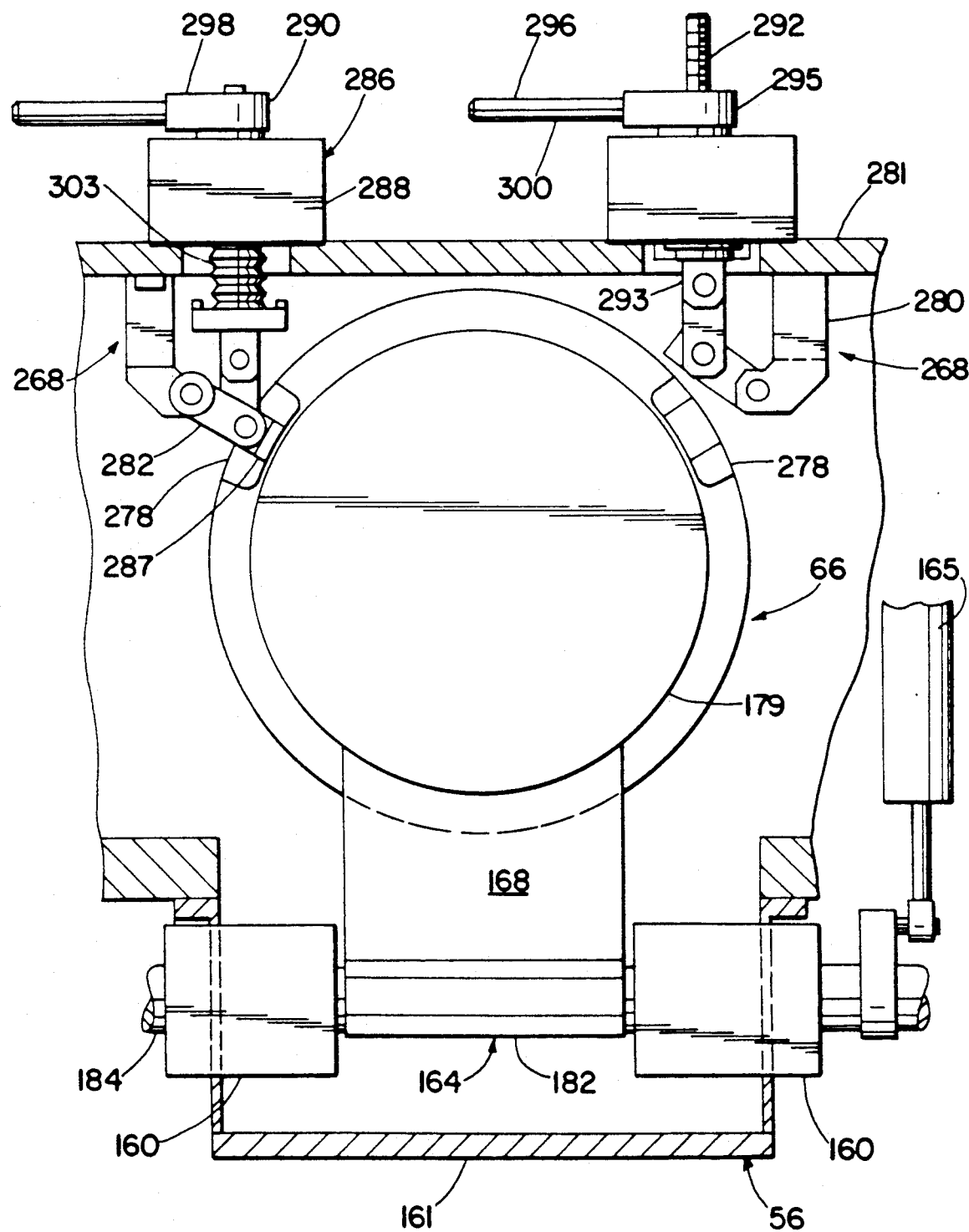
FIG. 10 is a rear elevation view of a platen assembly with parts shown in section to illustrate an atmospheric clamp assembly of the invention.
Figures 12, 13:
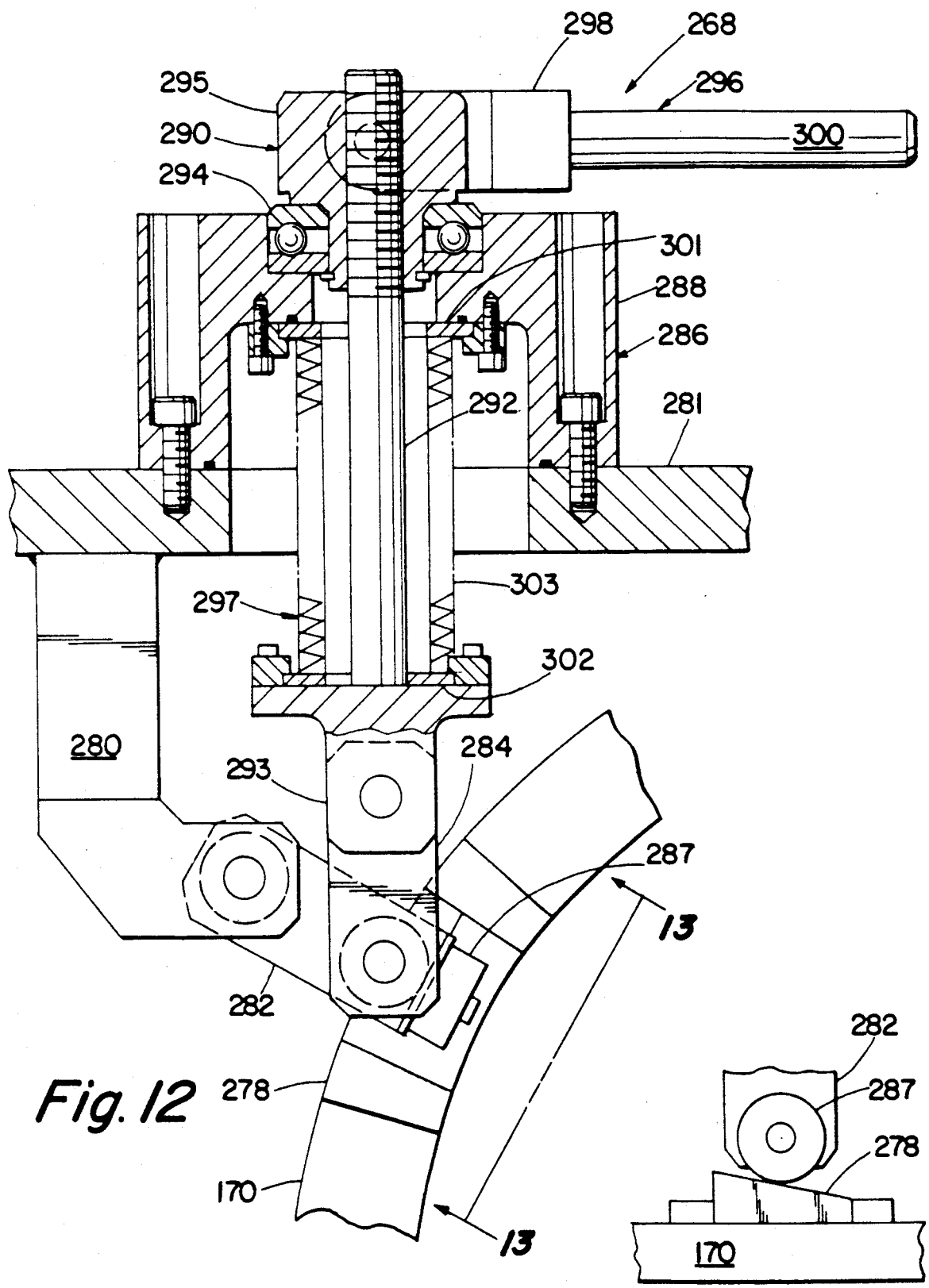
FIG. 12 is a fragmentary sectional view of a clamp assembly of the invention.
FIG. 13 is a fragmentary view along line 13—13 of FIG. 12.

Referring to FIG. 10, there is illustrated therein a pair of clamp assemblies designated generally by the numeral 268, while FIG. 12 shows an enlarged view of one of the clamp assemblies. The assemblies are essentially identical and will be described interchangeably herein.

The clamp assemblies 268 are essentially toggle clamps which are capable of applying a relatively high closing force to the platen against the wall of the staging chamber. Each toggle mechanism comprises a link arm mount 280 welded to the underside of a top wall member 281 of the staging chamber, a lock arm 282 pivotally attached at one end to the mount, and a connecting or toggle arm 284 pivotally attached to the opposite end of the lock arm, and to an actuating mechanism designated generally by the numeral 286. A wedge-shaped clamp surface member 278 (See FIG. 13) is attached to the back surface of the ring 170, and roller bearing 287 mounted on the end of the lock arm 282 rides up the wedge 278 to transmit the clamping force of the toggle assembly to the platen assembly and thus to side wall 60 of the staging chamber.

The actuating mechanism 286 comprises a mounting block 288 bolted to wall 281, and a manually operated drive screw assembly 290. The drive screw assembly 290 comprises a screw 292 extending through the mounting block and having a link end 293 fixed to the lower end thereof for attachment to the connecting arm 284, a bearing 294 pressed into the mounting block 288, a drive nut 295 threaded onto the screw and retained to the bearing by a snap ring, a handle 296 pivotally attached to the drive nut, and a vacuum bellows assembly 297 attached at its upper end to the mounting block and at its lower end to the link end 293.

The handle comprises a yoke 298 which fits over opposite flats of the nut and is pinned thereto, and a rod 300 fixed to the closed end of the yoke, the handle being capable of being flipped over 180° from the position shown. The bellows assembly 297 comprises an upper flange 301 clamped to the block 288, a lower flange 302 clamped to the link end 293 and a metallic bellows 303 welded to the flanges. O-rings between the flanges and their associated mounting members maintain the vacuum integrity of the clamp assembly.

Referring to FIG. 10, the right hand clamp assembly is shown in its open position, and the left hand clamp is shown in its closed position. The clamp assembly is moved from the open to the closed position by rotating the drive nut 295 with the handle assembly in a direction which will cause the screw to move downward. The downward movement of the screw causes the lock arm 282 to move to the closed position, with the connecting arm 284 acting as to toggle to lock the assembly in the closed position.

OPERATION

Cassettes 28 of wafers 30 are initially deposited on the platform 26. At the commencement of a processing cycle wafers are transferred one-by-one by the handling assembly 34 from the cassettes to the flat finder 32 and then to a rack 41 positioned within one or the other of the load locks 22. When the rack is fully loaded the lock is partially evacuated using pumping means not shown, following which the corresponding plenum valve 49 is opened and the load lock is evacuated to the desired level. When the desired vacuum level is reached the heaters 45 are energized to effect degassing of the batch of wafers. While the batch in the first load lock is undergoing the degassing process the rack in the second load lock 22 will have been positioned in the staging chamber 14 for transfer one at a time to selected processing chambers.

When the degassing operation is complete the valve 49 in the first load lock is closed and the elevator 47 is actuated to move the batch of wafers from the load lock to the staging chamber 14, which is maintained under vacuum by a dedicated vacuum pump. At this time processing of the batch originally in the second load lock will have been completed and the processed wafers returned to the rack on the second elevator. The second elevator is then actuated to return the batch of wafers to the second load lock, whereupon the second load lock is vented to atmosphere, and the wafers are returned to a cassette 28 by the picking arm 37. A new batch of wafers is then loaded into the second load lock as described above where the evacuation and degassing processes are carried out in preparation for further processing.

When the rack 41 is within the staging chamber 14, each of the wafers thereon is accessible by the wafer handling assembly 24. Referring to FIG. 1, if the wafer handling arm 80 of the handling assembly 24 is in the position shown, and the left side rack as viewed in FIG. 2 is positioned within the staging chamber, the arm 80 would first be rotated clockwise (from the FIG. 1 position) until the paddle 142 is positioned opposite the rack. The arm 80 is then raised to position the paddle just below the level of the wafer to be processed, further clockwise to put the paddle directly under the wafer, raised further to lift the wafer off the rack, and then rotated counterclockwise to extract the wafer from the rack and lowered to a position suitable for accessing the individual processing stations 16–19. When the wafer is extracted, proper positioning of the wafer on the paddle is verified by the proximity sensors 154.

Once the wafer is extracted and proper positioning verified the arm is rotated counterclockwise to position the paddle over the platen at a desired one of the processing stations 16–19. To accept a wafer from the paddle, the platen assembly is put in its horizontal position as shown in FIG. 7, with the clamp assembly in its raised position as shown in FIG. 9. With the platen so positioned, the arm 80 is rotated until the paddle enters the opening 255 and the wafer is centered over the platen 194. The arm is then lowered to deposit the wafer on the two pins 257 and third pin 258 and the arm is rotated to retract the paddle. The clamp assembly is then moved downward to clamp the wafer against the platen where it can then be preheated by contact with the platen, which has been preheated by the heating unit 209.

For processing, the platen assembly is rotated from the broken line position of FIG. 11 to the solid line position wherein the platen assembly sealingly engages a wall of the staging chamber adjacent to a processing chamber such as the sputtering chamber 18, whereupon the chamber 18 can be evacuated by its dedicated pumping system in preparation for processing. Upon completion of processing the platen assembly is returned to its horizontal position and the clamp assembly is positioned for extraction of the wafer by the arm 80. The wafer can then be moved to another station for further processing, or if processing is completed, returned to a rack 41 below one of the load locks from which they can then be returned to cassettes on the platform 26 by means of the elevator 47 and the handling assembly 34. While the processing of one batch is being carried out, the second batch of wafers can be undergoing the degassing process.

It is important to note in considering the above sequence of events that from the time the wafers are loaded onto the racks 41 until they are returned to the cassettes after processing they are not subjected to any direct radial movement. The arm 80 undergoes vertical (Z) and rotational (Θ) motion only in transferring wafers between the racks and the platens. This lack of radial motion greatly reduces the potential for misaligning the wafers in the transfer process and for generating particulates caused by relative motion between the wafers and the handling components. The radial movement of the wafer which might ordinarily be required to inject the wafer into a processing chamber is accomplished by the pivoting movement of the platen assembly which also permits the platen assembly to serve as a valve isolating the process stations from the staging chamber, and orients the wafers in the desired vertical position for processing.

We claim:

1. In a method for processing substrates, the steps of moving substrates into a first vacuum chamber to form a first batch of substrates within said chamber, evacuating said first vacuum chamber to a subatmospheric pressure, heating said first batch of substrates to effect degassing thereof within said first vacuum chamber, transferring said first batch of substrates as a unit from said first vacuum chamber to a transfer site within a second vacuum chamber, evacuating said second vacuum chamber to a subatmospheric pressure, transferring said substrates from said first batch at said transfer site one at a time to any one of a plurality of transfer stations within said second vacuum chamber, and then transferring a substrate from said one of a plurality of transfer stations to a vacuum processing chamber adjacent the transfer station.

2. A method as claimed in claim 1, including the step of simultaneously effecting vacuum isolation between said second vacuum chamber and said vacuum processing chamber when said substrate is transferred from said transfer station to said vacuum processing chamber.

3. A method as claimed in claim 1 including providing another of said first vacuum chamber communicating with said second vacuum chamber in parallel with the first, moving substrates into said another of such first vacuum chamber to form a second batch of substrates, evacuating said another of said first vacuum chamber to a subatmospheric pressure, and heating said second batch of substrates to effect degassing thereof; said evacuation of said another of said first vacuum chamber and said heating of said second batch being carried out while the steps commencing with the transfer of said first batch to said second vacuum chamber are carried out.

4. A method as claimed in claim 3, including transferring said second batch of substrates as a unit from said another of said first vacuum chamber to said transfer site within said second vacuum chamber.

5. A method as claimed in claim 1, wherein the transfer of substrates from said batch to said transfer stations is effected by moving a substrate through a first vertical movement to release it from said batch, moving said substrate along a substantially constant radius arcuate path between said transfer site and said any one transfer station, and moving said substrate through a second vertical movement to deposit it at said transfer station, said first and second vertical movements and said movement along said arcuate path being the only degrees of motion to which said substrates are subjected during said transfer.

6. A method as claimed in any one of claims 1, 3, 4 or 5, wherein said substrates are semiconductor wafers and are maintained in a horizontal position during said steps of moving said substrates into said first vacuum chamber, transferring said batch of substrates from said first vacuum chamber to said transfer site, and transferring said substrates from said transfer site to said transfer station; and wherein said wafers are shifted from said horizontal positions to a vertical position when they are transferred to a vacuum processing chamber.

7. Apparatus for processing substrates comprising a first vacuum chamber; a second vacuum chamber communicating with said first vacuum chamber; means for selectively effecting vacuum isolation between said first vacuum chamber and said second vacuum chamber; a plurality of third vacuum chambers each communicating with said second vacuum chamber; means for forming a batch of substrates within said first vacuum chamber; heating means within said first vacuum chamber operable to degas said batch of substrates; first transfer means operable to transfer said batch of substrates as a unit from said first vacuum chamber to a transfer site within said second vacuum chamber; a plurality of substrate transfer stations within said second vacuum chamber, each of said transfer stations being disposed adjacent one of said third vacuum chambers; second transfer means operable to transfer substrates one at a time between said transfer site and any one of said transfer stations and between one transfer station and any other transfer station in random order; third transfer means operatively associated with each of said transfer stations and operable to transfer a substrate from said transfer station to an adjacent third vacuum chamber and means associated with each of said transfer stations for effecting vacuum isolation between said second vacuum chamber and a third vacuum chamber adjacent that transfer station.

8. Apparatus as claimed in claim 7, wherein said transfer stations are located on the perimeter of a circle, said transfer site is also disposed on said perimeter, and said second substrate transfer means comprises an arm of fixed length movable arcuately about a vertical axis, said arm including substrate engaging means operable to engage and retain a substrate thereon.

9. Apparatus as claimed in claim 8, wherein said arm is also movable in a direction parallel to said vertical axis, the vertical and arcuate movements being the only degrees of movement to which said arm and a substrate engaged thereby are subjected.

10. Apparatus as claimed in claim 8, wherein said transfer site comprises first and second transfer locations disposed on said perimeter; said apparatus further including another of said first vacuum chamber communicating with said second vacuum chamber, means for selectively effecting vacuum isolation between said another of said first vacuum chamber and said second vacuum chamber, means for forming a batch of substrates within said another of said first vacuum chamber, heating means within said other first vacuum chamber operable to degas said batch of substrates therein, and another of said first transfer means operable to transfer a batch of substrates as a unit from said another of said first vacuum chamber to the second transfer location within said transfer site; said second transfer means being operable to transfer substrates from either of said transfer locations.

11. Apparatus as claimed in any one of claims 7, 8, 9, 10, in which each of said transfer stations comprises a substrate receiving platen having a substrate support surface formed thereon, and said third transfer means comprises means for moving said platen about a horizontal axis between a first position wherein said substrate support surface is oriented horizontally within said second vacuum chamber and a second position wherein said substrate support surface is oriented vertically within one of said third vacuum chambers.

12. Apparatus as claimed in claim 11 in which said means for effecting vacuum isolation between a transfer station and an adjacent third vacuum chamber comprises seal means formed on said platen.

* * * * *